United States Patent
Lee et al.

(10) Patent No.: US 7,838,327 B2
(45) Date of Patent: Nov. 23, 2010

(54) ORGANIC LIGHT-EMITTING DEVICE INCLUDING TRANSPARENT CONDUCTING OXIDE LAYER AS CATHODE AND METHOD OF MANUFACTURING THE SAME

(75) Inventors: Chang-Ho Lee, Suwon-si (KR);
Jin-Baek Choi, Suwon-si (KR);
Won-Jong Kim, Suwon-si (KR);
Jong-Hyuk Lee, Suwon-si (KR);
Young-Woo Song, Suwon-si (KR);
Yong-Tak Kim, Suwon-si (KR);
Yoon-Hyeung Cho, Suwon-si (KR);
Byoung-Duk Lee, Suwon-si (KR);
Min-Ho Oh, Suwon-si (KR);
Sun-Young Lee, Suwon-si (KR);
So-Young Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/053,900

(22) Filed: Mar. 24, 2008

(65) Prior Publication Data
US 2008/0246050 A1      Oct. 9, 2008

(30) Foreign Application Priority Data
Apr. 5, 2007    (KR) .................. 10-2007-0033749

(51) Int. Cl.
*H01L 51/40*    (2006.01)
(52) U.S. Cl. .................. 438/99; 257/40; 257/E51.001
(58) Field of Classification Search ............ 257/40; 438/99
See application file for complete search history.

(56) References Cited

U.S. PATENT DOCUMENTS

| 7,276,186 B2 * | 10/2007 | Abe ................. 252/518.1 |
| 2001/0017791 A1 | 8/2001 | Funyu et al. |
| 2004/0048157 A1 * | 3/2004 | Neudecker et al. ....... 429/231.2 |
| 2005/0064239 A1 | 3/2005 | Shuichi et al. |
| 2006/0202614 A1 * | 9/2006 | Li .................... 313/506 |
| 2007/0114921 A1 * | 5/2007 | Yamazaki et al. ........... 313/504 |

FOREIGN PATENT DOCUMENTS

DE      103 23 303 A1 *    4/2004

(Continued)

OTHER PUBLICATIONS

Office Action 2008-065866 issued by the Japanese Patent Office on May 11, 2010.

*Primary Examiner*—Wai-Sing Louie
(74) *Attorney, Agent, or Firm*—Stein McEwen, LLP

(57) ABSTRACT

An organic light-emitting device including a transparent conducting oxide layer as a cathode and a method of manufacturing the organic light-emitting device. The organic light-emitting device includes an anode disposed on a substrate. An organic functional layer including at least an organic light-emitting layer is disposed on the anode. The transparent conducting oxide layer used as the cathode is disposed on the organic functional layer. The transparent conducting oxide layer cathode is formed by plasma-assisted thermal evaporation. A microcavity structure is not formed in the organic light-emitting device, thereby avoiding a luminance change and a color shift as a function of viewing angle.

8 Claims, 4 Drawing Sheets

FOREIGN PATENT DOCUMENTS

| | | |
|---|---|---|
| EP | 1 734 150 A1 | 12/2006 |
| JP | 10-162959 | 6/1998 |
| JP | 2000-273620 | 10/2000 |
| JP | 2001-209086 | 8/2001 |
| JP | 2001-243772 | 9/2001 |
| JP | 2003-142261 | 5/2003 |
| JP | 2005-093418 | 4/2005 |
| JP | 2005-123124 | 5/2005 |
| JP | 2006-054147 | 2/2006 |
| JP | 2006-307320 | 11/2006 |
| JP | 2006-347807 | 12/2006 |

\* cited by examiner

ORGANIC LIGHT-EMITTING DEVICE INCLUDING TRANSPARENT CONDUCTING OXIDE LAYER AS CATHODE AND METHOD OF MANUFACTURING THE SAME

CROSS-REFERENCE TO RELATED APPLICATIONS

This application claims the benefit of Korean Patent Application No. 2007-33749, filed Apr. 5, 2007 in the Korean Intellectual Property Office, the disclosure of which is incorporated herein in its entirety by reference.

BACKGROUND OF THE INVENTION

1. Field of the Invention

Aspects of the present invention relate to an organic light-emitting device and a method of manufacturing the same. More particularly, aspects of the present invention relate to an organic light-emitting device that includes a transparent conducting oxide layer as a cathode and a method of manufacturing the organic light-emitting device.

2. Description of the Related Art

Generally, organic light-emitting devices include an anode, an organic light-emitting layer disposed on the anode, and a cathode disposed on the organic light-emitting layer. When a voltage is applied between the anode and the cathode, holes from the anode are injected into the organic light-emitting layer, and electrons from the cathode are injected into the organic light-emitting layer. The holes and the electrons injected into the organic light-emitting layer are recombined to generate excitons, emitting light upon transition of the excitons from an excited state to a ground state.

Organic light-emitting devices are largely classified into a bottom-emission type wherein light emitted from an organic light-emitting layer is transmitted through a lower substrate and a top-emission type wherein light emitted from an organic light-emitting layer is transmitted through an upper substrate. Top-emission type organic light-emitting devices have the advantage of having a higher aperture ratio than bottom-emission type organic light-emitting devices.

In top-emission type organic light-emitting devices, a cathode, which is a light-transmissive electrode, is formed as a metal layer having a low work function so as to provide electron injection characteristics, e.g., an MgAg layer. However, a metal cathode exhibits great reflectivity with respect to light at a visible light wavelength region. Thus, top-emission type organic light-emitting devices including a metal cathode essentially have a microcavity structure. Such a microcavity structure causes a luminance change and a color shift as a function of viewing angle. Moreover, because of the microcavity structure, it is necessary to strictly control the thickness of various organic functional layers, including the organic light-emitting layer, within a film uniformity range of 2% or less. This seriously hinders the mass production of organic light-emitting devices.

SUMMARY OF THE INVENTION

Several aspects of the present invention provide a top-emission type organic light-emitting device having no microcavity characteristics.

An aspect of the present invention provides an organic light-emitting device including: an anode disposed on a substrate; an organic functional layer disposed on the anode including at least an organic light-emitting layer; and a cathode that is a transparent conducting oxide layer disposed on the organic functional layer.

The transparent conducting oxide layer may be formed using plasma-assisted thermal evaporation. The transparent conducting oxide layer may be an indium oxide layer, an indium tin oxide layer, a tin oxide layer, an indium zinc oxide layer, an aluminum zinc oxide layer, an aluminum tin oxide layer, or an aluminum indium oxide layer.

The electron injection enhancing layer may be disposed between the organic functional layer and the cathode. The electron injection enhancing layer may be a metal layer having a thickness less than a skin depth. The electron injection enhancing layer may be a layer including Mg, Ca, or In.

The anode may include gold (Au) or platinum (Pt). The anode may also be a layer made of a transparent conducting oxide material doped with an insulating oxide material. The transparent conducting oxide material may be indium oxide, indium tin oxide, tin oxide, indium zinc oxide, aluminum zinc oxide, aluminum tin oxide, or aluminum indium oxide, and the insulating oxide material may be lanthanum oxide, yttrium oxide, beryllium oxide, titanium oxide, silicon oxide, gallium oxide, palladium oxide, or samarium oxide.

Another aspect of the present invention provides a method of manufacturing an organic light-emitting device, the method including: forming an anode on a substrate; forming an organic functional layer including at least an organic light-emitting layer on the anode; and forming a cathode as a transparent conducting oxide layer on the organic functional layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
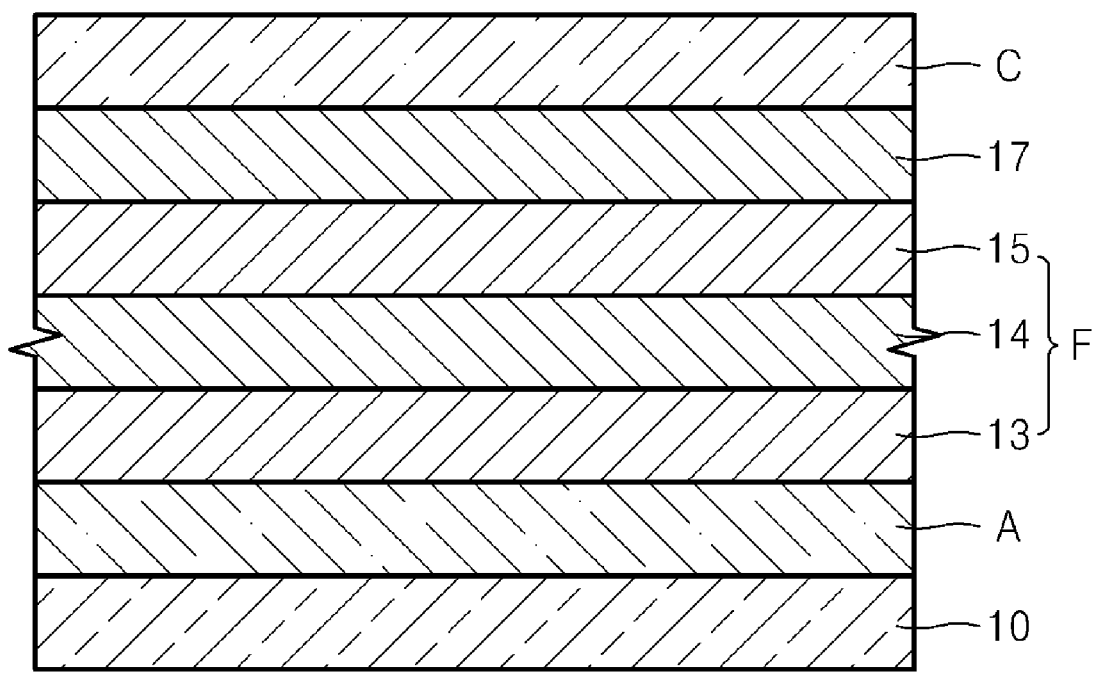
FIG. 1 is a sectional view illustrating an organic light-emitting device according to an embodiment of the present invention.

The present embodiments of the present invention will now be described more fully with reference to the accompanying drawings, in which exemplary embodiments of the invention are shown. This invention may, however, be embodied in many different forms and should not be construed as being limited to the embodiments set forth herein. When a layer is referred to as being "on" another layer or a substrate, it can be directly on the other layer or the substrate or an intervening layer may also be present. The same reference numerals and letters refer to the same constitutional elements throughout the specification. Moreover, it is to be understood that where it is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process. The embodiments are described below in order to explain the present invention by referring to the figures.

FIG. 1 is a sectional view illustrating an organic light-emitting device according to an embodiment of the present invention. As shown in FIG. 1, an anode A is disposed on a device substrate 10. The device substrate 10 may include at least one thin film transistor (not shown) connected to the anode A.

The work function of the anode A may range from 4.8 to 6.0 eV. Preferably, the work function of the anode A ranges from 5.5 to 6.0 eV. The anode A may be a light-transmissive electrode or a light-reflective electrode. When the anode A is a light-reflective electrode having a work function of 5.5 to 6.0 eV, the anode A may be a gold (Au) layer or a platinum (Pt) layer.

When the anode A is a light-transmissive electrode having a work function of 5.5 to 6.0 eV, the anode A may be a transparent conducting oxide layer doped with insulating oxide. The transparent conducting oxide is a material having a work function generally of 4.8 to 5.2 eV, and may be Indium Oxide, Indium Tin Oxide, Tin Oxide, Indium Zinc Oxide, Aluminum Zinc Oxide, Aluminum Tin Oxide or Aluminum Indium Oxide. The insulating oxide is a material having a higher work function than the transparent conducting oxide, and may be lanthanum oxide, yttrium oxide, beryllium oxide, titanium oxide, silicon oxide, gallium oxide, palladium oxide or samarium oxide. The transparent conducting oxide layer doped with insulating oxide can have appropriate light transmittance and conductivity by adjusting the ratio of the transparent conducting oxide and the insulating oxide. The anode A may be formed using sputtering, evaporation, ion beam deposition, electron beam deposition or laser ablation.

An organic functional layer F including at least an organic light-emitting layer 14 is disposed on the anode A. The organic functional layer F may further include a hole transport layer 13 between the organic light-emitting layer 14 and the anode A. When the work function of the anode A ranges from 5.5 to 6.0 eV, a material forming the hole transport layer 13 can be selected from a wide variety of materials. That is, the valence band (HOMO) energy level of the hole transport layer 13 may be selected from a very broad range of 5.1 to 6.5 eV. For example, the hole transport layer 13 may also be formed using a host material forming the organic light-emitting layer 14. When the anode A has a very high work function of 5.5 to 6.0 eV, even though a hole injection layer is not further interposed between the anode A and the hole transport layer 13, the organic light-emitting device can exhibit low driving voltage characteristics and high emission efficiency characteristics. That is, the anode A and the hole transport layer 13 can be directly in contact with each other.

The hole transport layer 13 may be made of a low molecular weight material, e.g., 1,3,5-tricarbazolylbenzene, 4,4'-biscarbazolylbiphenyl, poly(9-vinylcarbazole), m-biscarbazolylphenyl, 4,4'-biscarbazolyl-2,2'-dimethylbiphenyl, 4,4', 4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4, 4'-diamine (TPD), N,N'-di(naphthalene-1-yl)-N,N'-diphenylbenzidine (α-NPD), or N,N'-diphenyl-N,N'-bis(1-naphthyl)-(1,1'-biphenyl)-4,4'-diamine (NPB), or a polymer material, e.g., poly(9,9-dioctylfluorene-co-N-(4-butylphenyl)diphenylamine (TFB), poly(9,9-dioctylfluorene-co-bis-N,N'-(4-butylphenyl)-bis-N,N'-phenyl-1,4-phenylenediamine (PFB), or poly(9,9-dioctylfluorene-co-bis-N,N-(4-butylphenyl)-bis-N,N-phenylbenzidine (BFE). The hole transport layer 13 may be formed using vapor deposition, spin coating, inkjet printing, or laser-induced thermal imaging.

The organic light-emitting layer 14 may be a phosphorescent light-emitting layer or a fluorescent light-emitting layer. When the organic light-emitting layer 14 is a fluorescent light-emitting layer, the organic light-emitting layer 14 may include a material selected from the group consisting of distyrylarylene (DSA), DSA derivatives, distyrylbenzene (DSB), DSB derivatives, DPVBi (4,4'-bis(2,2'-diphenyl vinyl)-1,1'-biphenyl), DPVBi derivatives, spiro-DPVBi, and spiro-6P (spiro-sexiphenyl). Furthermore, the organic light-emitting layer 14 may further include a dopant material selected from the group consisting of styrylamine-based, phenylene-based, and DSBP (distyrylbiphenyl)-based materials. On the other hand, when the organic light-emitting layer 14 is a phosphorescent light-emitting layer, the organic light-emitting layer 14 may include a host material selected from the group consisting of allylamine-based, carbazole-based, and spiro-based materials. Preferably, the host material is a material selected from the group consisting of CBP (4,4'-N,N dicarbazole-biphenyl), CBP derivatives, mCP (N,N-dicarbazolyl-3,5-benzene), mCP derivatives, and spiro-based derivatives. Furthermore, the organic light-emitting layer 14 may include a phosphorescent organometallic complex having a central metal selected from the group consisting of Ir, Pt, Tb, and Eu as a dopant material. The phosphorescent organometallic complex may be one selected from the group consisting of PQIr, PQIr(acac), $PQ_2Ir$(acac), PIQIr(acac), and PtOEP.

For full-color organic light-emitting devices, the organic light-emitting layer 14 may be formed by vacuum deposition using a high-resolution mask, inkjet printing, or laser-induced thermal imaging. A hole blocking layer (not shown) may be disposed on the organic light-emitting layer 14. The hole blocking layer serves to prevent diffusion of excitons generated in the organic light-emitting layer 14 during operating the organic light-emitting device. The hole blocking layer may be made of Balq, BCP, CF-X, TAZ, or spiro-TAZ.

The organic functional layer F may further include an electron transport layer 15 that is disposed on the organic light-emitting layer 14. The conduction band (LUMO) energy level of the electron transport layer 15 may range from about 2.8 to 3.5 eV. The electron transport layer 15 facilitates transport of electrons into the organic light-emitting layer 14. For example, the electron transport layer 15 may be made of a polymer material, such as PBD, TAZ, or spiro-PBD, or a low molecular weight material, such as Alq3, BAlq, or SAlq. The electron transport layer 15 may be formed using vacuum deposition, spin coating, inkjet printing, or laser-induced thermal imaging.

A cathode C is disposed on the organic functional layer F. The cathode C is a transparent conducting oxide layer. Thus, most of the light emitted from the organic light-emitting layer 14 is transmitted through the cathode C, thereby eliminating microcavity characteristics. Therefore, a luminance change and a color shift as a function of viewing angle can be prevented. The cathode C may be an indium oxide layer, an indium tin oxide layer, a tin oxide layer, an indium zinc oxide layer, an aluminum zinc oxide layer, an aluminum tin oxide layer, or an aluminum indium oxide layer. The cathode C may have a work function of 4.8 to 5.2 eV.

The cathode C may be formed using plasma-assisted thermal evaporation. According to a conventional thermal evaporation process, a solid material is placed in a crucible and heated at a temperature higher than the melting point or sublimation point of the solid material so as to evaporate the solid material and the evaporated material is deposited on a substrate. When forming the cathode C as a transparent conducting layer using the conventional thermal evaporation process, the substrate 10 must be maintained at a temperature of 250 to 300° C. in order to achieve appropriate light transmittance and conductivity. However, high temperatures of 250 to 300° C. may cause thermal damage to the organic functional layer F.

On the other hand, in the plasma-assisted thermal evaporation process, plasma with a weak intensity is applied to the evaporated material so as to ionize the material, and the ionized material is then deposited on a substrate. When forming the cathode C as a transparent conducting layer using the plasma-assisted thermal evaporation process, the substrate 10 can be maintained at a temperature of 100° C., preferably 80° C. or less. Therefore, thermal damage to an organic functional layer F having a low thermal stability can be prevented. The cathode C formed using the plasma-assisted thermal evaporation exhibits a high transmittance of 85% or more over the entire visible light wavelength region, and a low sheet resistance of 20~70Ω/□. The plasma may be an oxygen plasma or an inert gas plasma. The inert gas may be argon (Ar) gas. When the solid material is a metal, the plasma must include oxygen. The plasma-assisted thermal evaporation may be performed at a vacuum level of 0.1~0.5 mTorr, at an inert gas flow rate of 5 to 30 sccm, and at an oxygen gas flow rate of 3-40 sccm.

Meanwhile, formation of the cathode C using a conventional sputtering process should be contrasted. In the sputtering process, when plasma is applied to a solid material, i.e., not to the evaporated material, atoms or molecules are sputtered from a surface of the solid material and then deposited on the organic functional layer F. In conventional sputtering, however, the intensity of the plasma is too high, thereby causing physical damage to the organic functional layer F. On the other hand, in plasma-assisted thermal evaporation, an ionized vapor is obtained from a solid material using both heat and plasma, and thus, plasma with a relatively low intensity can be applied. Thus, when forming the cathode C as a transparent conducting oxide layer using plasma-assisted thermal evaporation, the organic functional layer F is not physically damaged. In summary, the use of plasma-assisted thermal evaporation enables the formation of the cathode C as a transparent conducting oxide layer having good light transmittance and conductivity, without thermally or physically damaging the organic functional layer F.

An electron injection enhancing layer 17 may be further disposed between the organic functional layer F and the cathode C. The electron injection enhancing layer 17 is a layer having a lower work function than the cathode C, and facilitates the injection of electrons into the organic functional layer F. Specifically, the electron injection enhancing layer 17 is a metal layer having a work function of 3.6 to 3.7 eV and may have a thickness less than a skin depth. As used herein, the term "thickness less than the skin depth" refers to a thin thickness that has light transmittance of nearly 100%. That is, the electron injection enhancing layer 17 can enhance the injection of electrons into the organic functional layer F, without lowering the light transmittance. Thus, even when an electron injection layer is not further interposed between the electron transport layer 15 and the electron injection enhancing layer 17, the organic light-emitting device can exhibit low driving voltage characteristics and high emission efficiency characteristics. That is, the electron injection enhancing layer 17 may be formed to directly contact with the electron transport layer 15. The electron injection enhancing layer 17 may include magnesium (Mg), calcium (Ca), or indium (In), and may have a thickness of about 70 Å. Preferably, the electron injection enhancing layer 17 may be a magnesium (Mg) layer, a calcium (Ca) layer, or an indium (In) layer.

Figure 2A:
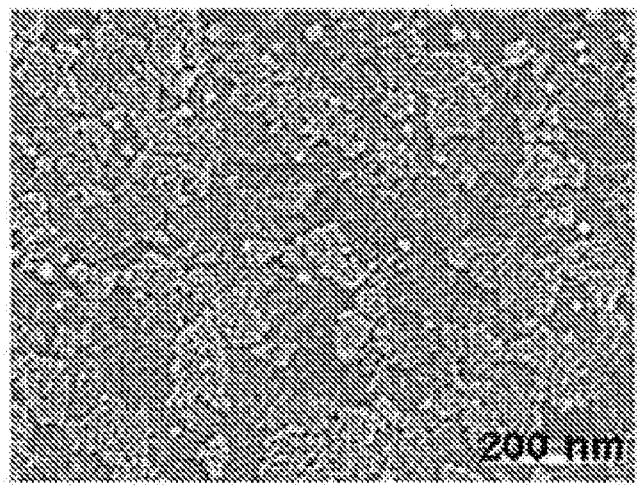
FIGS. 2A and 2B are scanning electron microscopic (SEM) images showing an indium oxide layer formed using a conventional sputtering process and an indium oxide layer formed using a plasma-assisted thermal evaporation process, respectively.
Figure 2B:
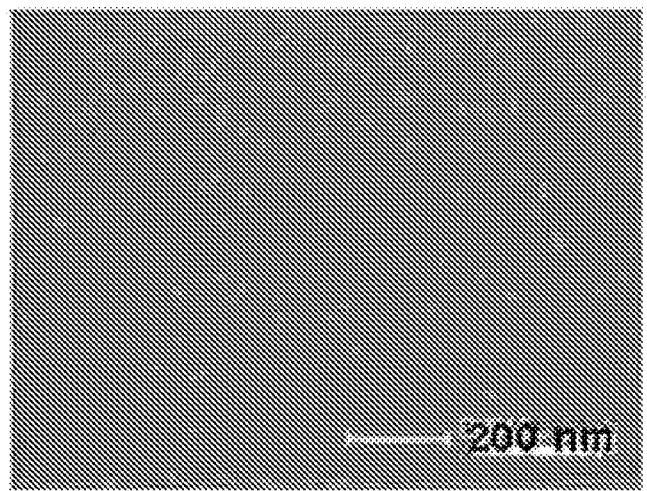

FIGS. 2A and 2B are scanning electron microscopic (SEM) images showing an indium oxide layer formed using a conventional sputtering process and an indium oxide layer formed using a plasma-assisted thermal evaporation process, respectively. For reference, in the sputtering process, the substrate was maintained at 200° C., and in the plasma-assisted thermal evaporation process, the substrate was maintained at 80° C. The indium oxide layers were formed to a thickness of 1000 Å.

Referring to FIGS. 2A and 2B, in the indium oxide layer formed using sputtering, grains had a very large particle size and a non-uniform particle distribution (see FIG. 2A), whereas in the indium oxide layer formed using the plasma-assisted thermal evaporation, grains had a very small particle size and a uniform particle distribution (see FIG. 2B). In addition, the indium oxide layer formed using sputtering exhibited a sheet resistance of 400Ω/□, and the indium oxide layer formed using plasma-assisted thermal evaporation exhibited a sheet resistance of 31.7Ω/□.

Figure 3:
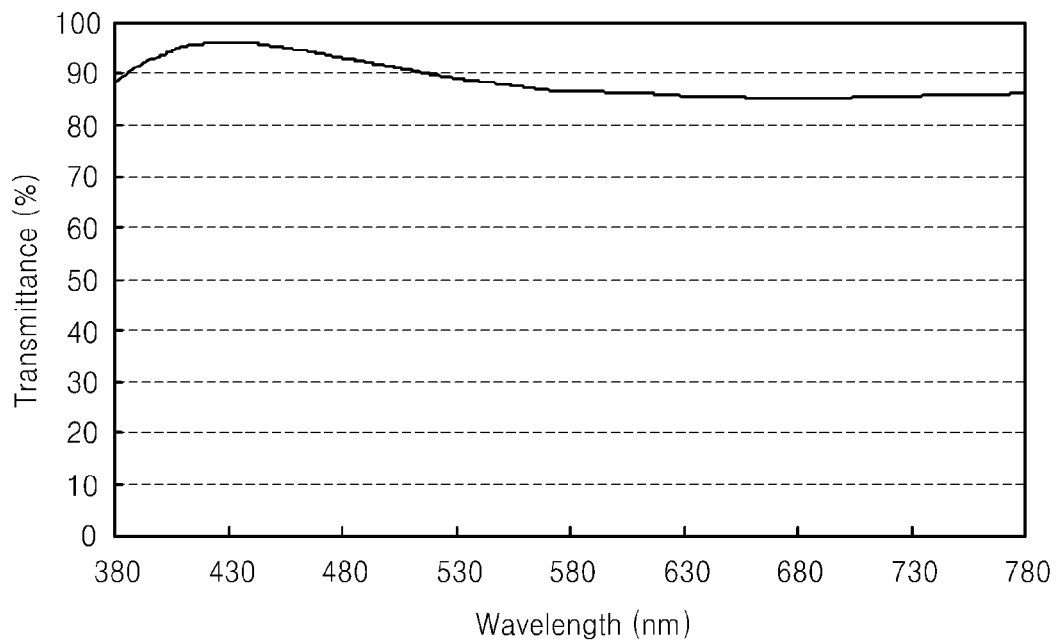
FIG. 3 is a graph illustrating the transmittance of an indium oxide layer, formed using a plasma-assisted thermal evaporation process, with respect to wavelength.

FIG. 3 is a graph illustrating the transmittance of an indium oxide layer formed using a plasma-assisted thermal evaporation process with respect to wavelength. As shown in FIG. 3, the indium oxide layer formed using plasma-assisted thermal evaporation exhibited a transmittance of 85% or more over the entire visible light wavelength region.

Hereinafter, the present invention will be described more specifically with reference to the following experimental examples. The following experimental examples are only for illustrative purposes and are not intended to limit the scope of the invention.

Evaluation of organic light-emitting devices including transparent conducting oxide layers as cathodes Manufacture Example Anodes were formed on substrates using gold (Au), and NPD (N,N'-diphenyl-N,N'-bis(1-naphthyl)-(1,1'-biphenyl)-4,4'-diamine) was deposited to a thickness of 50 nm on the anodes to form hole transport layers. 100 parts by weight of DSA (distyrylarylene) and 3 parts by weight of TBPe (tetra (t-butyl)perylene) were co-deposited on the hole transport layers to form blue light-emitting layers with a thickness of 30 nm. Balq (bis(2-methyl-8-quinolato)-(p-phenylphenolato)-aluminum) was deposited to a thickness of 5 nm on the blue light-emitting layers to form hole blocking layers. Bebq2 (bis(benzoquinoline)beryllium) was deposited to a thickness of 20 nm on the hole blocking layers to form electron transport layers. LiF was deposited to a thickness of 1 nm on the electron transport layers to form electron injection layers. Indium oxide was deposited on the electron injection layers using plasma-assisted thermal evaporation to form cathodes.

Comparative Example 1

Organic light-emitting devices were manufactured in the same manner as in the Manufacture Example except that indium oxide was deposited on the electron injection layers using sputtering to form cathodes.

Comparative Example 2

Indium tin oxide layers were deposited on substrates to form anodes. CuPc was deposited to a thickness of 60 nm on the anodes to form hole injection layers, and NPD was then deposited to a thickness of 30 nm on the hole injection layers to form hole transport layers. 100 parts by weight of DSA and 3 parts by weight of TBPe were co-deposited on the hole transport layers to form blue light-emitting layers with a thickness of 25 nm. Balq was deposited to a thickness of 5 nm on the light-emitting layers to form hole blocking layers, Alq3 was deposited to a thickness of 20 nm on the hole blocking layers to form electron transport layers, LiF was deposited to a thickness of 1 nm on the electron transport layers to form electron injection layers, and aluminum was deposited on the electron injection layers using thermal evaporation to form cathodes.

Figure 4:
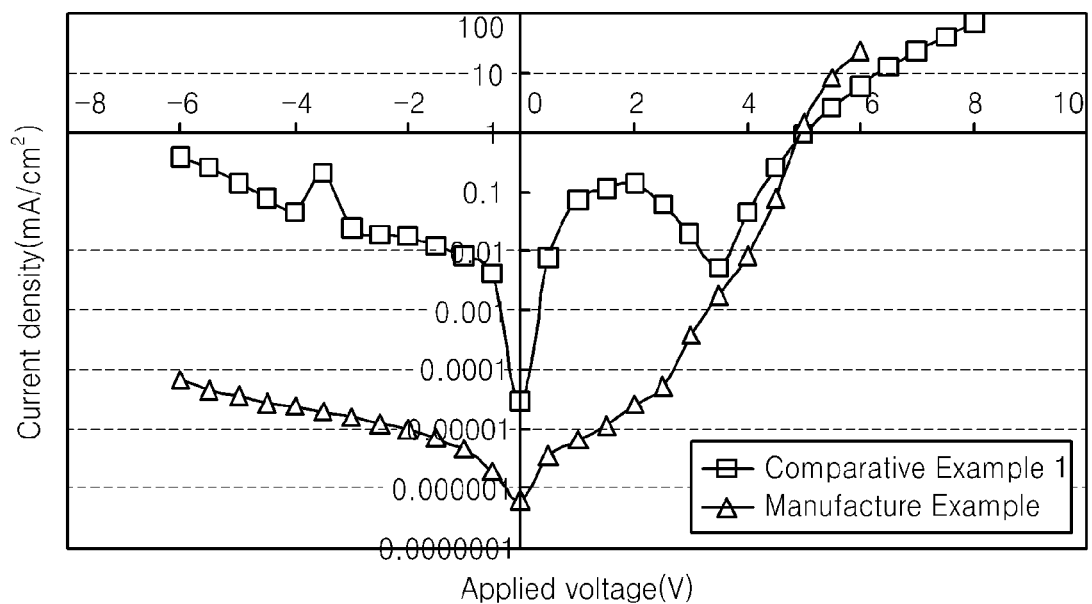
FIG. 4 is a graph illustrating current density-voltage characteristics of organic light-emitting devices manufactured in the Manufacture Example and Comparative Example 1.

FIG. 4 is a graph illustrating current density-voltage characteristics of the organic light-emitting devices manufactured in the Manufacture Example and Comparative Example 1. As seen in FIG. 4, the organic light-emitting devices manufactured in Comparative Example 1 exhibit a relatively large leakage current in the reverse bias region. This result shows that the formation of a cathode as a transparent conducting oxide layer using sputtering causes breakage or damage of an organic bond in the organic layer. On the other hand, the organic light-emitting devices manufactured in the Manufacture Example exhibit a low current density of $10^{-5}$ mA or less in the reverse bias region.

Figure 5:
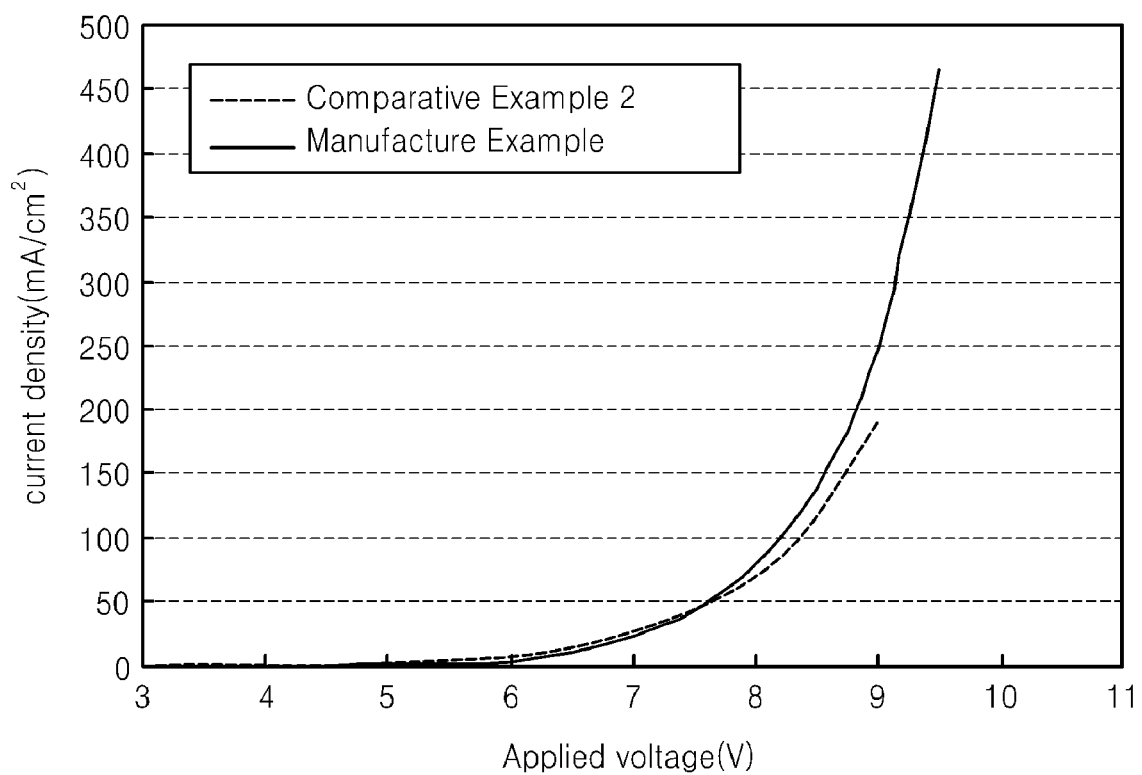
FIG. 5 is a graph illustrating current density-voltage characteristics of organic light-emitting devices manufactured in the Manufacture Example and Comparative Example 2.

FIG. 5 is a graph illustrating current density-voltage characteristics of the organic light-emitting devices manufactured in the Manufacture Example and Comparative Example 2. The organic light-emitting devices manufactured in Comparative Example 2 are commercially available devices including indium tin oxide layers having a work function of 4.8 eV as anodes and aluminum layers having a work function of 4.3 eV as cathodes. On the other hand, the organic light-emitting devices manufactured in the Manufacture Example include gold layers having a work function of 5.6 eV as anodes and indium oxide layers having a work function of 4.8 eV as cathodes. That is, the work functions of the electrodes of organic light-emitting devices manufactured in the Manufacture Example were shifted to higher levels than those of the electrodes of the organic light-emitting devices manufactured in Comparative Example 2. However, referring to FIG. 5, the organic light-emitting devices manufactured in the Manufacture Example and Comparative Example 2 exhibit almost similar current density-voltage characteristics. These results show that organic light-emitting devices including electrodes with higher work functions, as manufactured according to the Manufacture Example, can be stably operated.

As described above, these embodiments of the present invention provide the following advantages.

First, a cathode disposed on an organic functional layer is formed as a transparent conducting oxide layer, and thus microcavity characteristics of an organic light-emitting device disappear. Therefore, a luminance change and a color shift as a function of viewing angle can be prevented.

Second, a cathode disposed on an organic functional layer is formed as a transparent conducting oxide layer using plasma-assisted thermal evaporation. Thus, the cathode can be formed as a transparent conducting oxide layer having good light transmittance and conductivity without thermally or physically damaging the organic functional layer.

Third, an electron injection enhancing layer is further formed between an organic functional layer and a transparent conducting oxide layer used as a cathode. Therefore, injection of electrons into the organic functional layer can be enhanced, and thus, it is possible to omit the formation of an electron injection layer.

Fourth, a transparent conducting oxide layer having a work function of 4.8 to 5.2 eV is used as a cathode, and thus, the work function of an anode can be shifted to a high level ranging from 5.5 to 6.0 eV. An anode having such a high work function has a better hole injection capability into an organic functional layer, and thus, it is possible to omit the formation of a hole injection layer.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing an organic light-emitting device, the method comprising:
    forming an anode on a substrate;
    forming an organic functional layer on and in electrical contact with the anode, the formed organic functional layer comprising at least an organic light-emitting layer and a hole transport layer and/or an electron transport layer on the organic light-emitting layer; and
    forming a cathode as a transparent conducting oxide layer on and in electrical contact with the organic functional layer, wherein the transparent conducting oxide layer is formed using plasma-assisted thermal evaporation.

2. The method of claim 1, wherein the transparent conducting oxide layer is an indium oxide layer, an indium tin oxide layer, a tin oxide layer, an indium zinc oxide layer, an aluminum zinc oxide layer, an aluminum tin oxide layer, or an aluminum indium oxide layer.

3. The method of claim 1, further comprising forming an electron injection enhancing layer on and in electrical contact with the organic functional layer before forming the cathode on and in electrical contact with the electron injection enhancing layer.

4. The method of claim 3, wherein the electron injection enhancing layer is a metal layer having a thickness less than a skin depth.

5. The method of claim 4, wherein the electron injection enhancing layer comprises Mg, Ca, or In.

6. The method of claim 1, wherein the anode comprises gold (Au) or platinum (Pt).

7. The method of claim 1, wherein the anode is made of a transparent conducting oxide material doped with an insulating oxide material.

8. The method of claim 7, wherein:
    the transparent conducting oxide material is indium oxide, indium tin oxide, tin oxide, indium zinc oxide, aluminum zinc oxide, aluminum tin oxide, or aluminum indium oxide, and
    the insulating oxide material is lanthanum oxide, yttrium oxide, beryllium oxide, titanium oxide, silicon oxide, gallium oxide, palladium oxide, or samarium oxide.

* * * * *